US012765037B2

(12) United States Patent
Liu

(10) Patent No.: US 12,765,037 B2
(45) Date of Patent: Oct. 13, 2026

(54) SEMICONDUCTOR DEVICE AND FABRICATION METHOD THEREOF

(71) Applicant: UNITED MICROELECTRONICS CORP., Hsin-Chu City (TW)

(72) Inventor: Kuan-Liang Liu, Hsinchu County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 305 days.

(21) Appl. No.: 18/793,965

(22) Filed: Aug. 5, 2024

(65) Prior Publication Data

US 2026/0040654 A1 Feb. 5, 2026

(51) Int. Cl.

| | |
|---|---|
| ***H10D 64/66*** | (2025.01) |
| ***H10D 30/01*** | (2025.01) |
| ***H10D 30/62*** | (2025.01) |
| ***H10D 30/67*** | (2025.01) |
| ***H10D 64/01*** | (2025.01) |

(52) U.S. Cl.

CPC ......... *H10D 64/667* (2025.01); *H10D 30/024* (2025.01); *H10D 30/6215* (2025.01); *H10D 30/6735* (2025.01); *H10D 64/017* (2025.01); *H10D 64/021* (2025.01); *H10D 64/665* (2025.01)

(58) Field of Classification Search

CPC ............... H10D 64/667; H10D 30/024; H10D 30/6215; H10D 30/6735; H10D 64/017; H10D 64/021; H10D 64/665; H10D 84/834

See application file for complete search history.

(56) References Cited

U.S. PATENT DOCUMENTS

| | | | | |
|---|---|---|---|---|
| 8,536,040 | B1 | 9/2013 | Park | |
| 9,147,680 | B2 * | 9/2015 | Trevino | H10D 64/013 |
| 9,202,691 | B2 * | 12/2015 | Huang | H10D 30/60 |
| 9,425,103 | B2 * | 8/2016 | Xie | H10D 64/01318 |
| 9,691,877 | B2 * | 6/2017 | Basker | H10D 30/6211 |
| 11,682,710 | B2 * | 6/2023 | Huang | H10D 30/0223 257/401 |
| 2014/0110778 | A1 * | 4/2014 | Fumitake | H10D 30/60 257/330 |
| 2015/0021694 | A1 * | 1/2015 | Trevino | H10D 64/013 438/589 |

(Continued)

FOREIGN PATENT DOCUMENTS

| | | | | |
|---|---|---|---|---|
| CN | 102237399 A | * 11/2011 | | H10D 30/794 |
| CN | 105990445 A | * 10/2016 | | H10D 30/794 |

*Primary Examiner* — Mohammed Shamsuzzaman
(74) *Attorney, Agent, or Firm* — Winston Hsu

(57) ABSTRACT

A semiconductor device includes a substrate having a logic circuit region and a peripheral circuit region thereon, a dielectric layer on the substrate; a first gate trench in the dielectric layer within the logic circuit region, a second gate trench in the dielectric layer within the peripheral circuit region, a first replacement gate structure in the first gate trench, and a second replacement gate structure in the second gate trench. The second replacement gate structure includes a T-shaped second central bulk metal layer completely covers a top surface of a second gate dielectric layer and a second work function metal layer, and a second mask layer capping an upper portion of the second central bulk metal layer.

18 Claims, 7 Drawing Sheets

(56) References Cited

U.S. PATENT DOCUMENTS

| | | | | |
|---|---|---|---|---|
| 2015/0041905 | A1* | 2/2015 | Xie | H10D 64/01 257/369 |
| 2015/0069533 | A1* | 3/2015 | Lin | H10D 30/0227 257/410 |
| 2015/0076624 | A1* | 3/2015 | Liu | H10D 64/017 438/669 |
| 2016/0071944 | A1* | 3/2016 | Lu | H10D 64/01 438/591 |
| 2016/0163601 | A1* | 6/2016 | Xie | H10D 64/01318 438/591 |
| 2016/0284699 | A1* | 9/2016 | Jeong | H10D 64/021 |
| 2019/0131302 | A1* | 5/2019 | Yi | H10B 43/40 |
| 2020/0058553 | A1* | 2/2020 | Lim | H10D 64/017 |
| 2020/0335595 | A1* | 10/2020 | Huang | H10D 30/0223 |
| 2022/0157656 | A1* | 5/2022 | Tsai | H10D 30/024 |

* cited by examiner

SEMICONDUCTOR DEVICE AND FABRICATION METHOD THEREOF

BACKGROUND OF THE INVENTION

1. Field of the Invention

The present invention relates generally to the field of semiconductor technology, and in particular, to an embedded high-voltage finFET structure and a method for manufacturing the same.

2. Description of the Prior Art

FinFET process typically involves a tungsten etch back to recess a metal gate structure filled into a gate trench. An etch stop layer (or a hard mask layer) is then formed in the gate trench to facilitate the following self-aligned contact (SAC) process. However, the large-area medium-voltage (MV) or high-voltage (HV) embedded device fabricated in the peripheral circuit region may suffer from work-function metal undercut issue due to faster work function metal etching rate during the tungsten etch back, which impacts the HV/MV characteristics such as WIW uniformity, mismatch, etc.

SUMMARY OF THE INVENTION

It is one object of the invention to provide an improved semiconductor structure and a fabrication method thereof to improve the deficiencies or shortcomings of the prior art.

One aspect of the invention provides a semiconductor device including a substrate having a logic circuit region and a peripheral circuit region thereon, a dielectric layer on the substrate; a first gate trench in the dielectric layer within the logic circuit region, a second gate trench in the dielectric layer within the peripheral circuit region, a first replacement gate structure in the first gate trench, and a second replacement gate structure in the second gate trench.

The first replacement gate structure includes a first gate dielectric layer, a first work function metal layer on the first gate dielectric layer, and a first central bulk metal layer. The first gate dielectric layer and the first work function metal layer wrap around a lower portion of the first central bulk metal layer, and an upper portion of the first central bulk metal layer protrudes from a top surface of the first gate dielectric layer and the first work function metal layer. A first mask layer caps the upper portion of the first central bulk metal layer, the first gate dielectric layer and the first work function metal layer.

The second replacement gate structure includes a second gate dielectric layer, a second work function metal layer on the second gate dielectric layer, and a second central bulk metal layer. The second gate dielectric layer and the second work function metal layer wrap around a lower portion of the second central bulk metal layer, and an upper portion of the second central bulk metal layer completely covers a top surface of the second gate dielectric layer and the second work function metal layer. A second mask layer caps the upper portion of the second central bulk metal layer.

According to some embodiments, the first central bulk metal layer has an I-shaped sectional profile, and the second central bulk metal layer has a T-shaped sectional profile.

According to some embodiments, the second mask layer does not in direct contact with the second gate dielectric layer and the second work function metal layer.

According to some embodiments, the first replacement gate structure further comprises a first spacer layer between the dielectric layer and the first gate dielectric layer.

According to some embodiments, the second replacement gate structure further comprises a second spacer layer between the dielectric layer and the second gate dielectric layer, wherein the upper portion of the second central bulk metal layer is in direct contact with the second spacer layer.

According to some embodiments, the first spacer layer and the second spacer layer comprise silicon nitride, silicon oxide, silicon oxynitride, or any combinations thereof.

According to some embodiments, the first central bulk metal layer and the second central bulk metal layer comprise tungsten.

According to some embodiments, the first work function metal layer and the second work function metal layer comprise an N-type work function layer or a P-type work function layer.

According to some embodiments, the first work function metal layer and the second work function metal layer comprise Ti, TiN, TiAl, TiAlC, Al, AlN, Ta, TaN, TaC, TaCN, TaSiN, TaSi, or any combinations thereof.

According to some embodiments, the first replacement gate structure further comprises a first barrier layer between the lower portion of the first central bulk metal layer and the first work function metal layer, and the second replacement gate structure further comprises a second barrier layer between the lower portion of the second central bulk metal layer and the second work function metal layer.

Another aspect of the invention provides a method for forming a semiconductor device. A substrate having a logic circuit region and a peripheral circuit region thereon is provided. A dielectric layer is formed on the substrate. A first gate trench is formed in the dielectric layer within the logic circuit region. A second gate trench is formed in the dielectric layer within the peripheral circuit region.

A first replacement gate structure is formed in the first gate trench. The first replacement gate structure includes a first gate dielectric layer, a first work function metal layer on the first gate dielectric layer, and a first central bulk metal layer. The first gate dielectric layer and the first work function metal layer wrap around a lower portion of the first central bulk metal layer, and an upper portion of the first central bulk metal layer protrudes from a top surface of the first gate dielectric layer and the first work function metal layer. A first mask layer caps the upper portion of the first central bulk metal layer, the first gate dielectric layer and the first work function metal layer.

A second replacement gate structure is formed in the second gate trench. The second replacement gate structure includes a second gate dielectric layer, a second work function metal layer on the second gate dielectric layer, and a second central bulk metal layer. The second gate dielectric layer and the second work function metal layer wrap around a lower portion of the second central bulk metal layer, and an upper portion of the second central bulk metal layer completely covers a top surface of the second gate dielectric layer and the second work function metal layer. A second mask layer caps the upper portion of the second central bulk metal layer.

According to some embodiments, the first central bulk metal layer has an I-shaped sectional profile, and the second central bulk metal layer has a T-shaped sectional profile.

According to some embodiments, the second mask layer does not in direct contact with the second gate dielectric layer and the second work function metal layer.

According to some embodiments, the method further includes the step of forming a first spacer layer between the dielectric layer and the first gate dielectric layer.

According to some embodiments, the method further includes the step of forming a second spacer layer between the dielectric layer and the second gate dielectric layer, wherein the upper portion of the second central bulk metal layer is in direct contact with the second spacer layer.

According to some embodiments, the first spacer layer and the second spacer layer comprise silicon nitride, silicon oxide, silicon oxynitride, or any combinations thereof.

According to some embodiments, the first central bulk metal layer and the second central bulk metal layer comprise tungsten.

According to some embodiments, the first work function metal layer and the second work function metal layer comprise an N-type work function layer or a P-type work function layer.

According to some embodiments, the first work function metal layer and the second work function metal layer comprise Ti, TiN, TiAl, TiAlC, Al, AlN, Ta, TaN, TaC, TaCN, TaSiN, TaSi, or any combinations thereof.

According to some embodiments, the method further includes the steps of forming a first barrier layer between the lower portion of the first central bulk metal layer and the first work function metal layer; and forming a second barrier layer between the lower portion of the second central bulk metal layer and the second work function metal layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
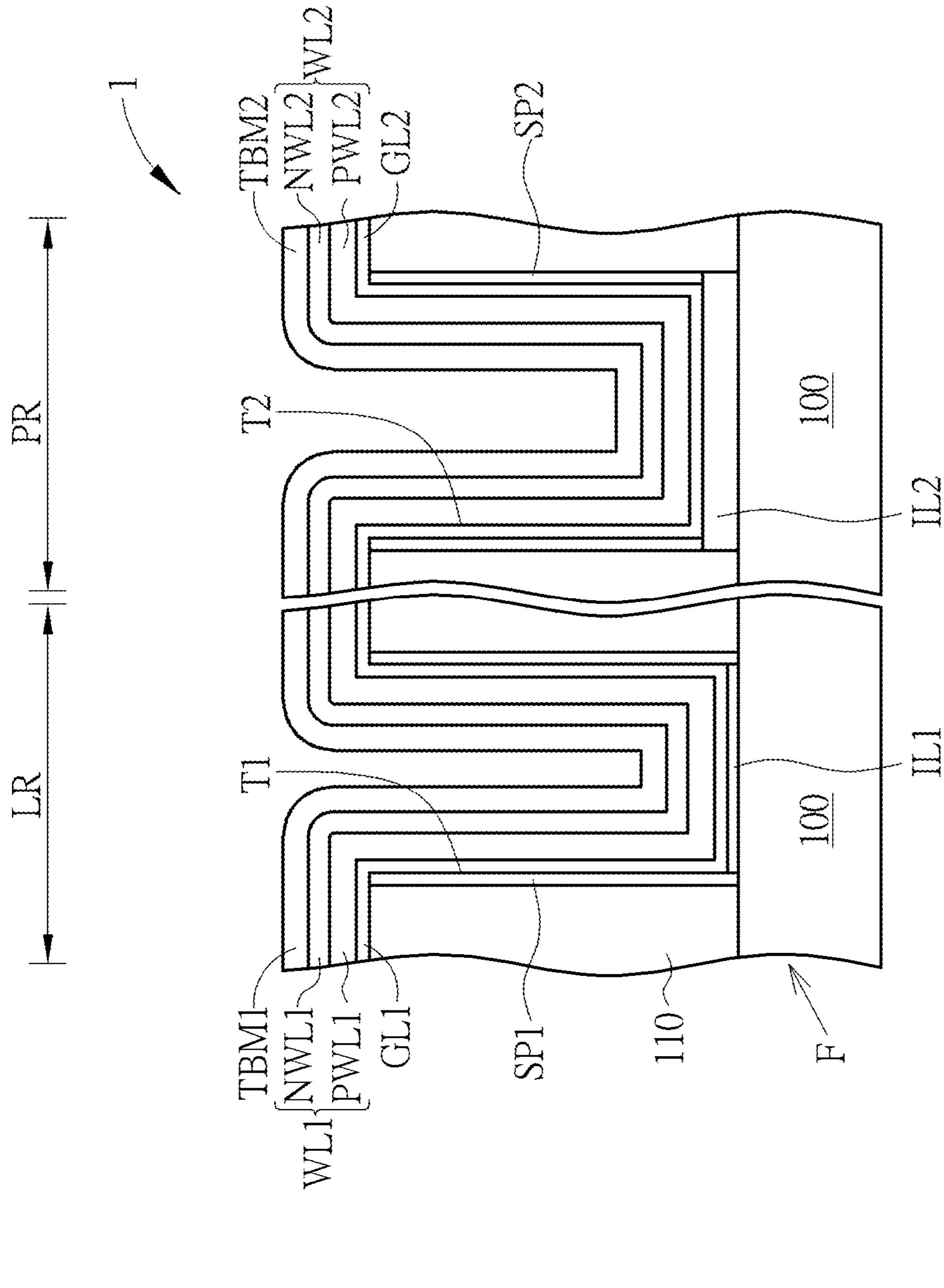
FIG. 1 to FIG. 7 are schematic, cross-sectional diagrams showing an exemplary method for forming a semiconductor device according to an embodiment of the invention.

Please refer to FIG. 1 to FIG. 7. FIG. 1 to FIG. 7 are schematic, cross-sectional diagrams showing an exemplary method for forming a semiconductor device 1 according to an embodiment of the invention. As shown in FIG. 1, a substrate 100 is provided. The substrate 100 comprises a logic circuit region LR and a peripheral circuit region PR thereon. A silicon fin structure F is formed within the logic circuit region LR. According to an embodiment, for example, a finFET is to be formed in the logic circuit region LR and a high-voltage planar-type transistor is to be formed in the peripheral circuit region PR. According to an embodiment, for example, the substrate 100 may comprise a silicon substrate, but is not limited thereto. A dielectric layer 110 is formed on the substrate 100. According to an embodiment, for example, the dielectric layer 110 may comprise silicon oxide, phosphosilicate glass (PSG), borophosphosilicate glass (BPSG), low-k material or ultra-low k material, but is not limited thereto.

According to an embodiment, a first gate trench T1 is formed in the dielectric layer 110 within the logic circuit region LR, and a second gate trench T2 is formed in the dielectric layer 110 within the peripheral circuit region PR. The first gate trench T1 may be defined by an outer sidewall of the first spacers SP1 and a top surface of the first interfacial oxide layer IL1. The second gate trench T2 may be defined by an outer sidewall of the second spacers SP2 and a top surface of the second interfacial oxide layer IL2. According to an embodiment, for example, the first spacers SP1 and second spacers SP2 may comprise silicon nitride, silicon oxy-nitride, silicon oxide, or any combinations thereof. According to an embodiment, for example, the first interfacial oxide layer IL1 and the second interfacial oxide layer IL2 may comprise silicon oxide. According to an embodiment, the second interfacial oxide layer IL2 is thicker than the first interfacial oxide layer IL1.

According to an embodiment, for example, the first gate trench T1 and the second gate trench T2 may be formed after performing a dummy poly-gate removal (DPR) process. The DPR process involves removing a sacrificial layer of polysilicon (dummy poly) that serves as a placeholder for the final metal gate electrode.

Subsequently, a chemical vapor deposition (CVD) process, an atomic layer deposition (ALD) process, or a physical vapor deposition (PVD) process may be performed. According to an embodiment, a first gate dielectric layer GL1, a first function metal layer WL1, and a first top barrier metal layer TBM1 are conformally deposited on the dielectric layer 110 and in the first gate trench T1. According to an embodiment, a second gate dielectric layer GL2, a second work function metal layer WL2, and a second top barrier metal layer TBM2 are conformally deposited on the dielectric layer 110 and in the second gate trench T2. According to some embodiments, the first work function metal layer WL1 and the second work function metal layer WL2 may comprise Ti, TiN, TiAl, TiAlC, Al, AlN, Ta, TaN, TaC, TaCN, TaSiN, TaSi, or any combinations thereof.

According to an embodiment, for example, the first function metal layer WL1 may comprise a first P work function metal layer PWL1 and/or a first N work function metal layer NWL1. According to an embodiment, for example, the second function metal layer W2 may comprise a second P work function metal layer PWL2 and/or a second N work function metal layer NWL2. The first spacer layer SP1 is between the dielectric layer 110 and the first gate dielectric layer GL1. The second spacer layer SP2 is between the dielectric layer 110 and the second gate dielectric layer GL2.

According to an embodiment, for example, the first gate dielectric layer GL1 and the second gate dielectric layer GL2 may comprise high-k dielectric layer such as hafnium oxide ($HfO_2$) hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or any combinations thereof. According to an embodiment, for example, the first P work function metal layer PWL1 and the second P work function metal layer PWL2 may comprise TiN. According to an embodiment, for example, the first N work function metal layer NWL1 and the second work function metal layer NWL2 may comprise TiAl or a TaAl. According to an embodiment, for example, the first top barrier metal layer TBM1 and the second top barrier metal layer TBM2 may comprise TaN.

Figure 2:
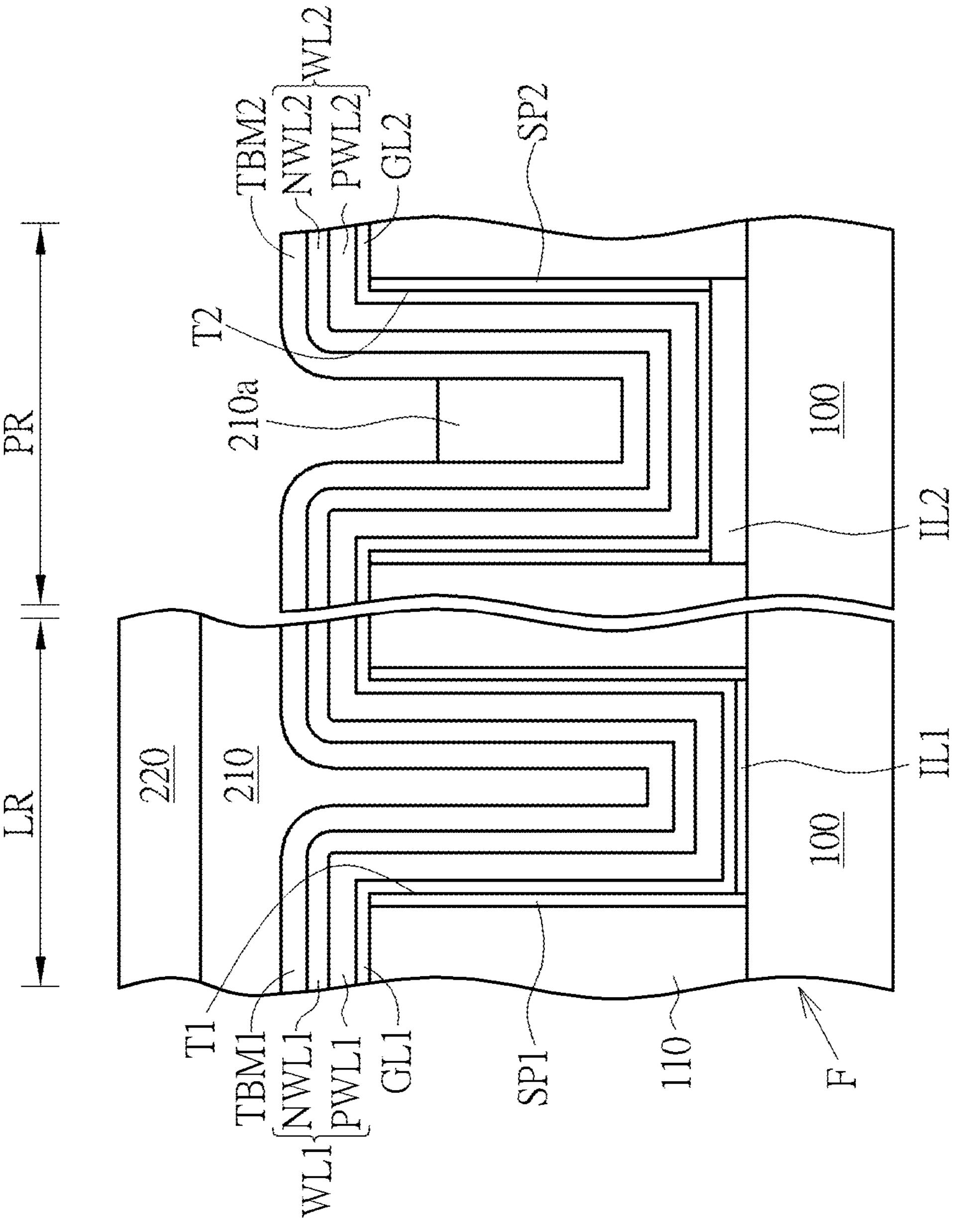

As shown in FIG. 2, a sacrificial layer 210 is then deposited on the substrate 100 in a blanket manner. According to an embodiment, for example, the sacrificial layer 210 may be a bottom anti-reflection coating (BARC), but is not limited thereto. The sacrificial layer 210 is filled into the first gate trench T1 and the second gate trench T2. Subsequently, a photoresist pattern 220 is formed on the sacrificial layer 210. The photoresist pattern 220 masks the logic circuit region LR. The photoresist pattern 220 does not cover the peripheral circuit region PR. The sacrificial layer 210 in the peripheral circuit region PR is exposed. An etching process is then performed to eth the sacrificial layer 210, thereby forming a temporary plug structure 210*a* in the second gate trench T2.

Figure 3:
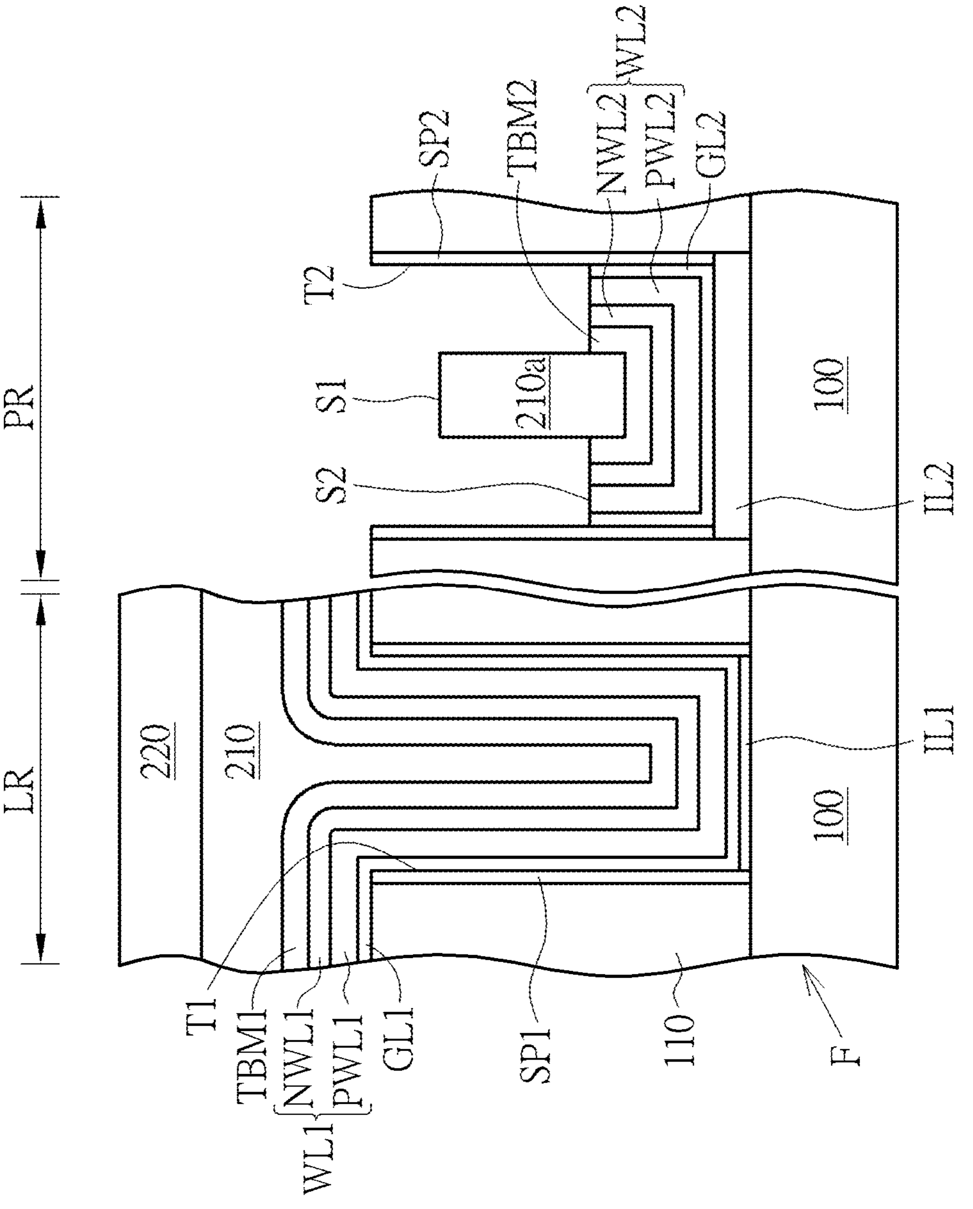

As shown in FIG. 3, an anisotropic dry etching process is then performed. The second gate dielectric layer GL2, the second work function metal layer WL2, and the second top barrier metal layer TBM2 in the peripheral circuit region PR are selectively etched (or pulled down) until a top surface S2 of the second gate dielectric layer GL2, the second work function metal layer WL2, and the second top barrier metal layer TBM2 is lower than a top surface S1 of the temporary plug structure 210*a*.

Figure 4:
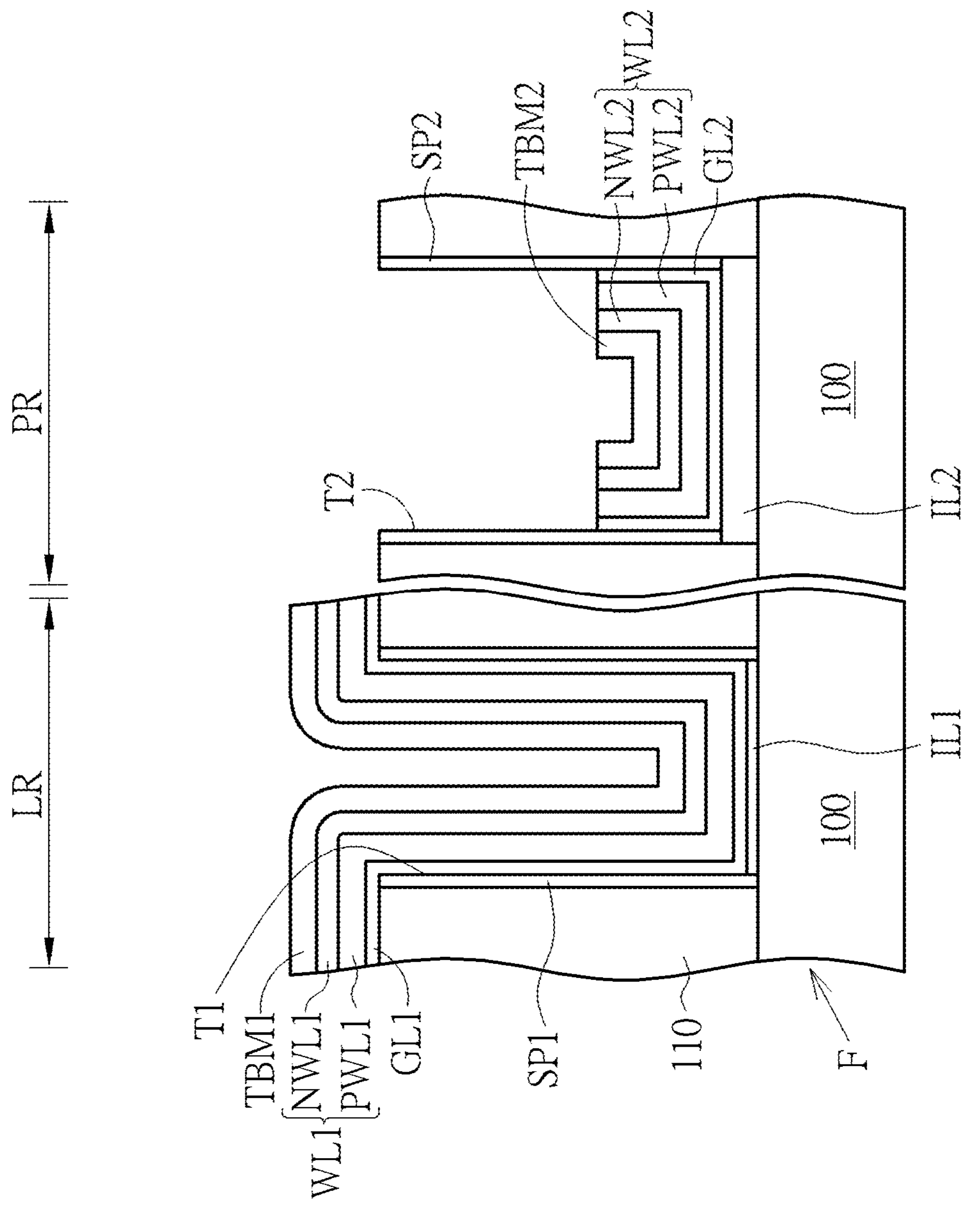

As shown in FIG. 4, subsequently, the remaining sacrificial layer 210 and the photoresist pattern 220 in the logic circuit region LR and the temporary plug structure 210*a* in the second gate trench T2 are completely removed. According to an embodiment, for example, the sacrificial layer 210, the temporary plug structure 210*a*, and the photoresist pattern 220 may be removed by methods known in the art, for example, etching or ashing processes, but is not limited thereto.

Figure 5:
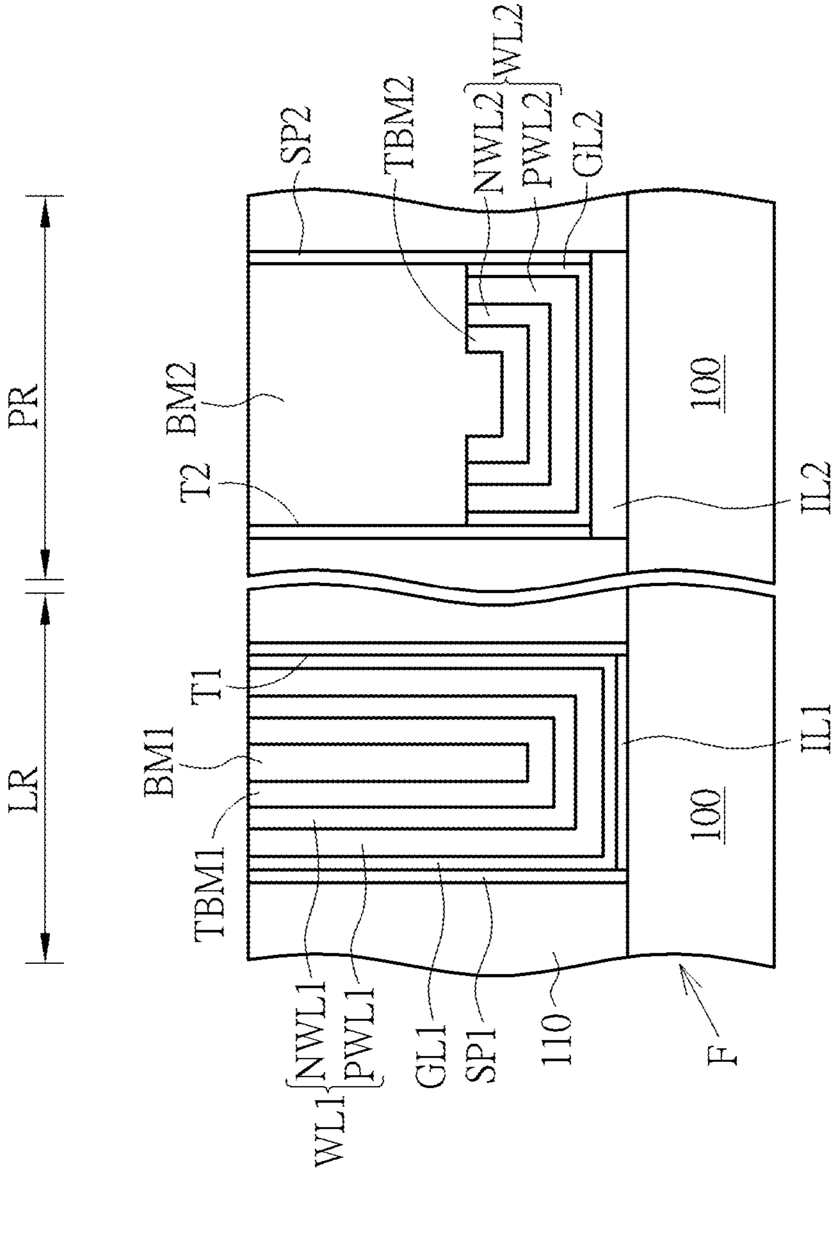

As shown in FIG. 5, a first central bulk metal layer BM1 and a second central bulk metal layer BM2 are respectively formed within the first gate trench T1 and the second gate trench T2. According to an embodiment, for example, the first central bulk metal layer BM1 and the second central bulk metal layer BM2 may comprise W, but is not limited thereto. For example, a tungsten layer may be deposited on the substrate 100 by using CVD or ALD methods. The tungsten layer is then subjected to a chemical mechanical polishing (CMP) process, thereby forming the first central bulk metal layer BM1 and the second central bulk metal layer BM2 embedded in the first gate trench T1 and the second gate trench T2, respectively. The second gate dielectric layer GL2, the second work function metal layer WL2, and the second top barrier metal layer TBM2 are capped by the second central bulk metal layer BM2.

Figure 6:
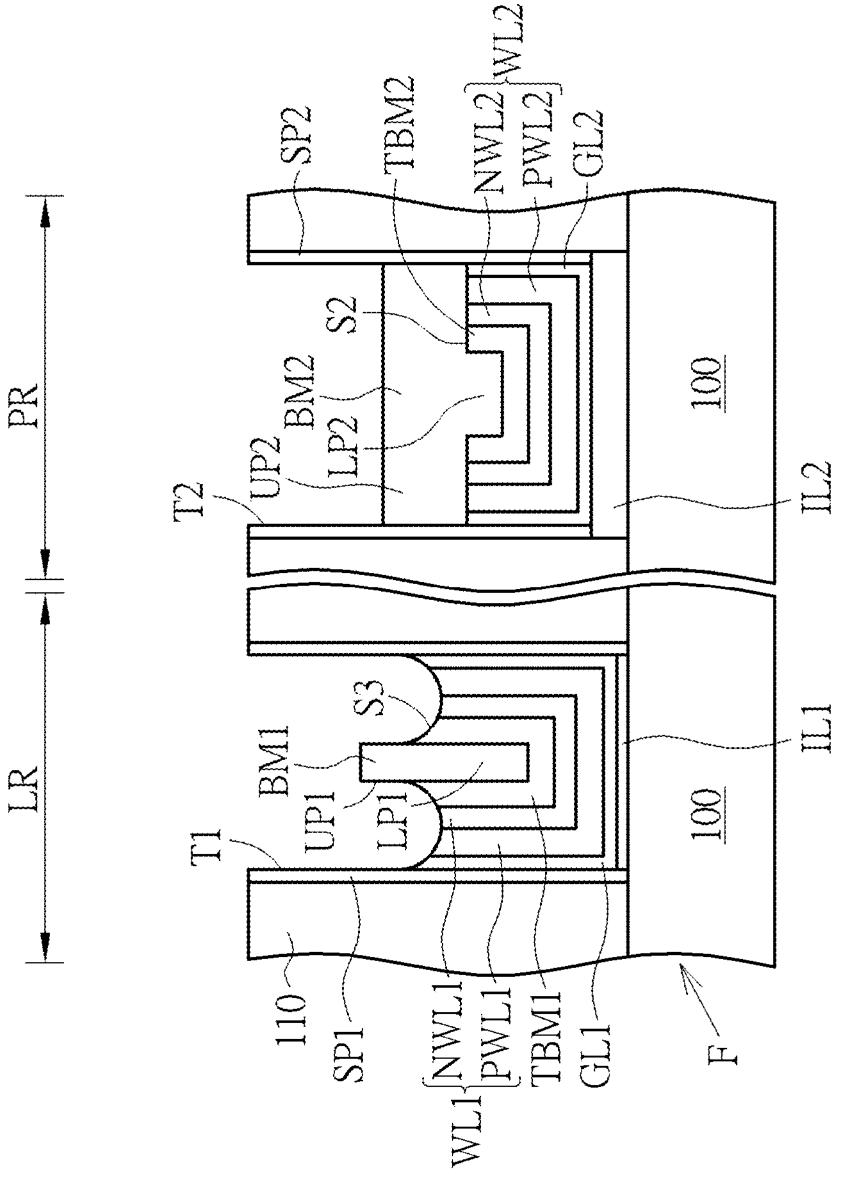

As shown in FIG. 6, an etch-back process is performed to etch the first central bulk metal layer BM1 and the second central bulk metal layer BM2. The first gate dielectric layer GL1, the first work function metal layer WL1, and the first top barrier metal layer TBM1 in the first gate trench T1 are also etched during the etch-back process. According to an embodiment, the remaining first central bulk metal layer BM1 has an I-shaped sectional profile and the remaining second central bulk metal layer BM2 has a T-shaped sectional profile.

According to an embodiment, for example, the first gate dielectric layer GL1, the first work function metal layer WL1, and the first top barrier metal layer TBM1 wrap around a lower portion LP1 of the first central bulk metal layer BM1, and an upper portion UP1 of the first central bulk metal layer BM1 protrudes from a top surface S3 of the first gate dielectric layer GL1, the first work function metal layer WL1 and the first top barrier metal layer TBM1.

According to an embodiment, for example, the second gate dielectric layer GL2, the second work function metal layer WL2, and the second top barrier metal layer TBM2 wrap around a lower portion LP2 of the second central bulk metal layer BM2, and an upper portion UP2 of the second central bulk metal layer BM2 completely covers the top surface S2 of the second gate dielectric layer GL2, the second work function metal layer WL2, and the second top barrier metal layer TBM2. According to an embodiment, the upper portion UP2 of the second central bulk metal layer BM2 is in direct contact with the second spacer layer SP2.

Figure 7:
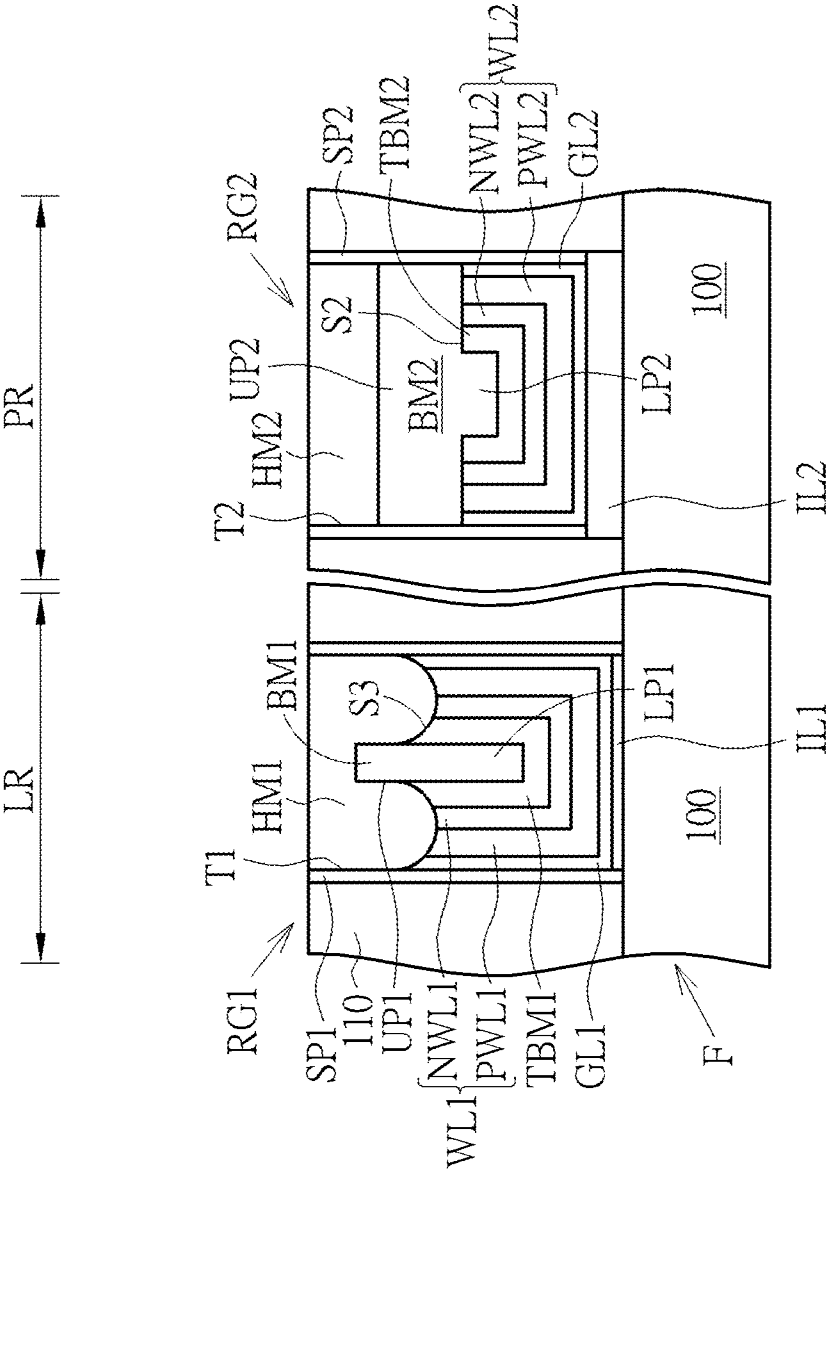

As shown in FIG. 7, a first mask layer HM1 is formed in the first gate trench T1 and a second mask layer is formed in the second gate trench T2, thereby forming a first replacement gate structure RG1 in the first gate trench T1 and a second replacement gate structure RG2 in the second gate trench T2. The first mask layer HM1 caps the upper portion UP1 of the first central bulk metal layer BM1, the first gate dielectric layer GL1, the first work function metal layer WL1, and the first top barrier metal layer TBM1. The second mask layer HM2 caps the upper portion UP2 of the second central bulk metal layer BM2. According to an embodiment, the second mask layer HM2 does not in direct contact with the second gate dielectric layer GL2, the second work function metal layer WL2, and the second top barrier metal layer TBM2.

Structurally, as shown in FIG. 7, the semiconductor device 1 includes a substrate 100 having a logic circuit region LR and a peripheral circuit region PR thereon. A dielectric layer 110 is formed on the substrate 100. A first gate trench T1 is formed in the dielectric layer 110 within the logic circuit region LR and a second gate trench T2 is formed in the dielectric layer 110 within the peripheral circuit region PR. A first replacement gate structure RG1 is formed in the first gate trench T1 and a second replacement gate structure RG2 is formed in the second gate trench T2.

The first replacement gate structure RG1 includes a first gate dielectric layer GL1, a first work function metal layer WL1 on the first gate dielectric layer GL1, and a first central bulk metal layer BM1. The first gate dielectric layer GL1 and the first work function metal layer WL1 wrap around a lower portion LP1 of the first central bulk metal layer BM1, and an upper portion UP1 of the first central bulk metal layer BM1 protrudes from a top surface S3 of the first gate dielectric layer GL1 and the first work function metal layer WL1. A first mask layer HM1 caps the upper portion UP1 of the first central bulk metal layer BM1, the first gate dielectric layer GL1 and the first work function metal layer WL1.

The second replacement gate structure RG2 includes a second gate dielectric layer GL2, a second work function metal layer WL2 on the second gate dielectric layer GL1, and a second central bulk metal layer BM2. The second gate dielectric layer GL2 and the second work function metal layer WL2 wrap around a lower portion LP2 of the second central bulk metal layer BM2, and an upper portion UP2 of the second central bulk metal layer BM2 completely covers a top surface S4 of the second gate dielectric layer GL2 and the second work function metal layer WL2. A second mask layer HM2 caps the upper portion UP2 of the second central bulk metal layer BM2.

According to an embodiment, the first central bulk metal layer BM1 has an I-shaped sectional profile, and the second central bulk metal layer BM2 has a T-shaped sectional profile.

According to an embodiment, the second mask layer HM2 does not in direct contact with the second gate dielectric layer GL2 and the second work function metal layer WL2.

According to an embodiment, the first replacement gate structure RG1 further comprises a first spacer layer SP1 between the dielectric layer 110 and the first gate dielectric layer GL1.

According to an embodiment, the second replacement gate structure RG2 further comprises a second spacer layer SP2 between the dielectric layer 110 and the second gate dielectric layer GL2, wherein the upper portion UP2 of the second central bulk metal layer BM2 is in direct contact with the second spacer layer SP2.

According to an embodiment, the first spacer layer SP1 and the second spacer layer SP2 comprise silicon nitride, silicon oxide, silicon oxynitride, or any combinations thereof.

According to an embodiment, the first central bulk metal layer BM1 and the second central bulk metal layer BM2 comprise tungsten.

According to an embodiment, the first work function metal layer WL1 and the second work function metal layer WL2 comprise an N-type work function layer or a P-type work function layer.

According to an embodiment, the first work function metal layer WL1 and the second work function metal layer WL2 comprise Ti, TiN, TiAl, TiAlC, Al, AlN, Ta, TaN, TaC, TaCN, TaSiN, TaSi, or any combinations thereof.

According to an embodiment, the first replacement gate structure RG1 further comprises a first barrier layer TBM1 between the lower portion LP1 of the first central bulk metal layer BM1 and the first work function metal layer WL1, and the second replacement gate structure RG2 further comprises a second barrier layer TBM2 between the lower portion LP2 of the second central bulk metal layer BM2 and the second work function metal layer WL2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a substrate having a logic circuit region and a peripheral circuit region thereon;

a dielectric layer on the substrate;

a first interfacial oxide layer on the substrate in the logic circuit region;

a second interfacial oxide layer thicker than the first interfacial oxide layer on the substrate in the peripheral circuit region;

a first gate trench in the dielectric layer within the logic circuit region;

a second gate trench in the dielectric layer within the peripheral circuit region;

a first replacement gate structure in the first gate trench, wherein the first replacement gate structure comprises a first gate dielectric layer, a first work function metal layer on the first gate dielectric layer, and a first central bulk metal layer, wherein the first gate dielectric layer and the first work function metal layer wrap around a lower portion of the first central bulk metal layer, and an upper portion of the first central bulk metal layer protrudes from a top surface of the first gate dielectric layer and the first work function metal layer, and wherein a first mask layer caps the upper portion of the first central bulk metal layer, the first gate dielectric layer and the first work function metal layer; and a second replacement gate structure in the second gate trench, wherein the second replacement gate structure comprises a second gate dielectric layer, a second work function metal layer on the second gate dielectric layer, and a second central bulk metal layer, wherein the second gate dielectric layer and the second work function metal layer wrap around a lower portion of the second central bulk metal layer, and an upper portion of the second central bulk metal layer completely covers a top surface of the second gate dielectric layer and the second work function metal layer, and wherein a second mask layer caps the upper portion of the second central bulk metal layer;

wherein the first central bulk metal layer has an I-shaped sectional profile, and the second central bulk metal layer has a T-shaped sectional profile.

2. The semiconductor device according to claim 1, wherein the second mask layer does not in direct contact with the second gate dielectric layer and the second work function metal layer.

3. The semiconductor device according to claim 1, wherein the first replacement gate structure further comprises a first spacer layer between the dielectric layer and the first gate dielectric layer.

4. The semiconductor device according to claim 3, wherein the second replacement gate structure further comprises a second spacer layer between the dielectric layer and the second gate dielectric layer, wherein the upper portion of the second central bulk metal layer is in direct contact with the second spacer layer.

5. The semiconductor device according to claim 4, wherein the first spacer layer and the second spacer layer comprise silicon nitride, silicon oxide, silicon oxynitride, or any combinations thereof.

6. The semiconductor device according to claim 1, wherein the first central bulk metal layer and the second central bulk metal layer comprise tungsten.

7. The semiconductor device according to claim 1, wherein the first work function metal layer and the second work function metal layer comprise an N-type work function layer or a P-type work function layer.

8. The semiconductor device according to claim 1, wherein the first work function metal layer and the second work function metal layer comprise Ti, TiN, TiAl, TiAlC, Al, AlN, Ta, TaN, TaC, TaCN, TaSiN, TaSi, or any combinations thereof.

9. The semiconductor device according to claim 1, wherein the first replacement gate structure further comprises a first barrier layer between the lower portion of the first central bulk metal layer and the first work function metal layer, and the second replacement gate structure further comprises a second barrier layer between the lower portion of the second central bulk metal layer and the second work function metal layer.

10. A method for forming a semiconductor device, comprising:

providing a substrate having a logic circuit region and a peripheral circuit region thereon;

forming a dielectric layer on the substrate;

forming a first interfacial oxide layer on the substrate in the logic circuit region;

forming a second interfacial oxide layer thicker than the first interfacial oxide layer on the substrate in the peripheral circuit region;

forming a first gate trench in the dielectric layer within the logic circuit region;

forming a second gate trench in the dielectric layer within the peripheral circuit region;

forming a first replacement gate structure in the first gate trench, wherein the first replacement gate structure comprises a first gate dielectric layer, a first work function metal layer on the first gate dielectric layer, and a first central bulk metal layer, wherein the first gate dielectric layer and the first work function metal layer wrap around a lower portion of the first central bulk metal layer, and an upper portion of the first central bulk metal layer protrudes from a top surface of the first gate dielectric layer and the first work function metal layer, and wherein a first mask layer caps the upper portion of the first central bulk metal layer, the first gate dielectric layer and the first work function metal layer; and forming a second replacement gate structure in the second gate trench, wherein the second replacement gate structure comprises a second gate dielectric layer, a second work function metal layer on the second gate dielectric layer, and a second central bulk metal layer, wherein the second gate dielectric layer and the second work function metal layer wrap around a lower portion of the second central bulk metal layer, and an upper portion of the second central bulk metal layer completely covers a top surface of the second gate dielectric layer and the second work function metal layer, and wherein a second mask layer caps the upper portion of the second central bulk metal layer;

wherein the first central bulk metal layer has an I-shaped sectional profile, and the second central bulk metal layer has a T-shaped sectional profile.

11. The method according to claim 10, wherein the second mask layer does not in direct contact with the second gate dielectric layer and the second work function metal layer.

12. The method according to claim 10 further comprising:

forming a first spacer layer between the dielectric layer and the first gate dielectric layer.

13. The method according to claim 12 further comprising:

forming a second spacer layer between the dielectric layer and the second gate dielectric layer, wherein the upper portion of the second central bulk metal layer is in direct contact with the second spacer layer.

14. The method according to claim 13, wherein the first spacer layer and the second spacer layer comprise silicon nitride, silicon oxide, silicon oxynitride, or any combinations thereof.

15. The method according to claim 10, wherein the first central bulk metal layer and the second central bulk metal layer comprise tungsten.

16. The method according to claim 10, wherein the first work function metal layer and the second work function metal layer comprise an N-type work function layer or a P-type work function layer.

17. The method according to claim 10, wherein the first work function metal layer and the second work function metal layer comprise Ti, TiN, TiAl, TiAlC, Al, AlN, Ta, TaN, TaC, TaCN, TaSiN, TaSi, or any combinations thereof.

18. The method according to claim 10 further comprising:

forming a first barrier layer between the lower portion of the first central bulk metal layer and the first work function metal layer, and forming a second barrier layer between the lower portion of the second central bulk metal layer and the second work function metal layer.

* * * * *